United States Patent
Oh et al.

(10) Patent No.: US 7,414,899 B2
(45) Date of Patent: Aug. 19, 2008

(54) METHOD AND APPARATUS FOR EARLY WRITE TERMINATION IN A SEMICONDUCTOR MEMORY

(75) Inventors: Jong Hoon Oh, Chapel Hill, NC (US); Alan Deng, Morrisville, NC (US)

(73) Assignee: Infineon Technologies North America Corp., Milpitas, CA (US)

( * ) Notice: Subject to any disclaimer, the term of this patent is extended or adjusted under 35 U.S.C. 154(b) by 167 days.

(21) Appl. No.: 11/414,570

(22) Filed: Apr. 28, 2006

(65) Prior Publication Data

US 2007/0253262 A1    Nov. 1, 2007

(51) Int. Cl.
*G11C 7/00* (2006.01)
(52) U.S. Cl. .................. 365/193; 365/194; 365/195; 365/233; 365/189.01
(58) Field of Classification Search ......... 365/193–195, 365/189.05, 189.01, 233; 711/104–105, 711/167; 712/300, 34–35, 216–219
See application file for complete search history.

(56) References Cited

U.S. PATENT DOCUMENTS

| 6,310,823 | B1 | 10/2001 | Nam |
| 6,466,221 | B1 | 10/2002 | Satoh et al. |
| 7,054,221 | B2 * | 5/2006 | Shim .......................... 365/233 |
| 7,143,258 | B2 * | 11/2006 | Bae ............................ 711/167 |

\* cited by examiner

*Primary Examiner*—David Lam
(74) *Attorney, Agent, or Firm*—Coats & Bennett, P.L.L.C.

(57) ABSTRACT

A synchronous DRAM (SDRAM) terminates a write operation in response to detecting deactivation of a data strobe signal applied to it during the write operation. In one example, the SDRAM comprises a buffer circuit and an early write termination circuit. The buffer circuit is configured to sample input data responsive to a data strobe signal applied to the SDRAM during a write operation and direct the input data to one or more memory cells of the SDRAM for storing the input data. The early write termination circuit is configured to terminate the write operation at less than a programmed burst length by disabling access to one or more of the memory cells after storage of the sampled input data responsive to detecting deactivation of the data strobe signal.

28 Claims, 8 Drawing Sheets

METHOD AND APPARATUS FOR EARLY WRITE TERMINATION IN A SEMICONDUCTOR MEMORY

BACKGROUND OF THE INVENTION

The present invention generally relates to dynamic random access memories (DRAMs), and particularly relates to terminating write operations in synchronous DRAMs (SDRAMs).

Data transfers to and from an SDRAM are initiated by a memory controller. The memory controller provides a series of instructions to the SDRAM in the form of commands along with corresponding data. The SDRAM receives, interprets and executes the commands. The commands are issued by the memory controller, and processed by the SDRAM, in synchronization with a system clock. Likewise, data is written to and read from the SDRAM in synchronization with the system clock.

To achieve improved data transfer speeds, some types of SDRAMs, in particular, double-data rate SDRAMs (DDR SDRAMs), incorporate data strobe signals. In operation, data strobe signals are output by the device providing data and received by the device capturing, or sampling, the data. For example, during read operations, a DDR SDRAM outputs data signals and a corresponding data strobe signal for use by a memory controller. The memory controller samples the data signals using the data strobe signal as a timing reference. Likewise, during write operations, the DDR SDRAM samples data signals using the data strobe signal as a timing reference.

Transferring data to and from SDRAMs in "bursts" further improves SDRAM performance. The length of a data burst, commonly referred to as burst length, defines the maximum number of memory array column locations that are accessed during a particular read or write operation. Accessing multiple column locations during a single memory operation reduces the latency associated with activating blocks of SDRAM memory cells. Burst length is programmed during a hardware initialization process of the SDRAM. Once programmed, it generally is inefficient to modify the burst length during SDRAM operation. The burst length can be modified only when all SDRAM memory banks are idle and no bursts are in progress. Additionally, the memory controller must wait a specified time after modifying the burst length before initiating a subsequent operation. As such, conducting memory operations based on programmed burst lengths sometimes results in inefficiency, such as when there is a need to write data in amounts smaller than the programmed burst length.

Conventional SDRAMs may support early write termination in a number of known ways. That is, conventional SDRAMs may terminate or truncate an ongoing write operation before its completion, e.g., at less than a programmed burst length. However, conventional early write termination techniques come at the expense of performance, risk of uncertainty, or both. For example, early write termination may be accomplished by issuing a precharge command during an ongoing write operation. The precharge command deactivates the open row currently being written to. Deactivating the open row during a write operation prevents the write burst from completing. However, the deactivated row will be unavailable for a subsequent access until a precharge latency is satisfied. Thus, the deactivated row can not be written to or read from immediately after the precharge command is used for early write termination. In addition to the precharge latency, the row must be re-activated before another read or write command can be issued to the same row. This row activation process further increases the latency penalty associated with using the precharge command as a method of early write termination.

Issuing a subsequent read or write command during an ongoing write operation also results in early write termination. However, this requires the memory controller to issue an additional command and the SDRAM to interpret this command. Furthermore, data must be available for transmission to the SDRAM when the subsequent command is issued. Also, when terminating an ongoing write operation by issuing a subsequent read command, data masking may be required depending upon the write-to-read command interval. For example, if the write-to-read command interval is greater than one clock cycle, then data masking may be required.

Use of a burst stop command represents another option for early write termination. However, the burst stop command is well defined for read operations only. Use of the burst stop command during ongoing write operations may cause data uncertainty. That is, uncertainty may arise as to which data was or was not written to the SDRAM when the burst stop command was issued. Further, because use of the burst stop command for early write termination is not a standardized technique, its use for this purpose may cause SDRAM malfunction.

SUMMARY OF THE INVENTION

According to the methods and apparatus taught herein, one embodiment of a method of terminating a write operation in a synchronous dynamic random access memory (SDRAM) at less than a programmed burst length comprises detecting early deactivation of a data strobe signal applied to the SDRAM during write operations and disabling memory cell access within the SDRAM responsive to said early deactivation of the data strobe signal to prevent the storage of invalid data. Disabling memory cell access for early write termination may comprise disabling access at least to memory locations corresponding to a truncated portion of the programmed burst length as indicated by deactivation of the data strobe signal.

Thus, in at least one embodiment, an SDRAM comprises a buffer circuit and an early write termination circuit. The buffer circuit is configured to sample input data responsive to a data strobe signal applied to the SDRAM during a write operation and direct the input data to one or more of the memory cells for storing the input data. The early write termination circuit is configured to terminate the write operation at less than a programmed burst length by disabling access to one or more of the memory cells after storage of the sampled input data responsive to detecting deactivation of the data strobe signal.

In one or more embodiments, the early write termination circuit comprises a detection circuit and a write enable circuit. The detection circuit is configured to detect deactivation of a data strobe signal applied to an SDRAM during a write operation. The write enable circuit is configured to terminate the write operation at less than a programmed burst length responsive to the detection circuit detecting deactivation of the data strobe signal.

Corresponding to the above early write termination methods and circuits, a complementary memory controller comprises in one embodiment control logic configured to terminate an ongoing write operation by deactivating a data strobe signal directed to an SDRAM by the memory controller during the ongoing write operation.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
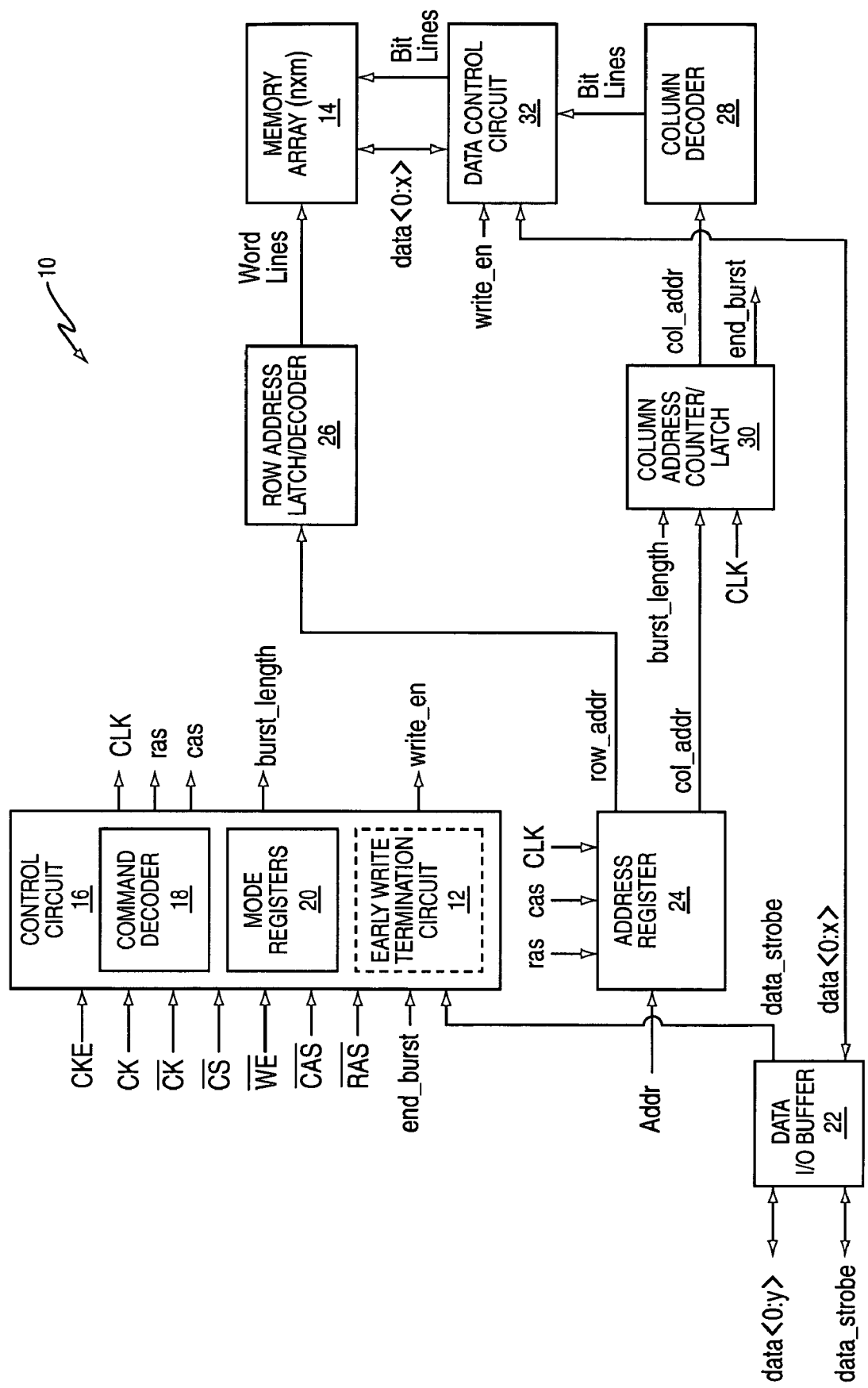
FIG. 1 is a block diagram of one embodiment of a synchronous DRAM.

An embodiment of an SDRAM 10, shown in FIG. 1, includes an early write termination circuit 12. The early write termination circuit 12 terminates or truncates an ongoing memory write operation before its completion, e.g., at less than a programmed burst length. Particularly, in response to detecting deactivation of a data strobe signal (data_strobe), the early write termination circuit 12 disables or otherwise inhibits storing of input data in one or more memory cells of the SDRAM 10 during a write operation. As such, an ongoing write operation of the SDRAM 10 may be reliably terminated before the operation has been completed. Note that "write termination" as used herein means, in at least one embodiment, inhibiting access to all or part of the SDRAM's internal memory arrays 14. The SDRAM 10 may or may not continue to execute the write command, even though the early write termination circuit 12 has inhibited memory array access.

The SDRAM 10 of FIG. 1 includes one or more banks of memory arrays for storing data. Each memory array includes a plurality of memory cells (not shown) having a storage element located at an intersection of a memory array word line (i.e., row) and bit line (i.e., column). For ease of illustration and description, FIG. 1 illustrates a single memory array bank 14. However, those skilled in the art will understand that the SDRAM 10 may include multiple memory array banks, and, as such, the early write termination circuit 12 can provide early write termination for any number of memory array banks.

Returning to the operational details of the SDRAM 10, a control circuit 16 is configured to receive external control signals, e.g., $\overline{CS}$, $\overline{WE}$, $\overline{CAS}$, and $\overline{RAS}$ generated by an external memory controller (not shown). The external control signals are received by the control circuit 16 in synchronization with a system clock, e.g., differential system clock CK and $\overline{CK}$. The SDRAM 10 generates an internal system clock (CLK) in synchronization with the external system clock. The SDRAM 10 generates CLK when a clock enable signal is active, e.g., CKE is active. CLK synchronizes internal operations of the SDRAM 10.

The control circuit 16 further includes a command decoder 18 and one or more mode registers 20. The command decoder 18 decodes the external control signals into one or more commands. Each decoded command instructs the SDRAM 10 to perform a particular operation. For example, the SDRAM 10 is instructed to perform a write operation when $\overline{CS}$, $\overline{WE}$, and $\overline{CAS}$ are active (logic low) and $\overline{RAS}$ is inactive (logic high). The mode registers 20 define the specific mode of operation of the SDRAM 10. For example, the mode registers 20 may define burst length, burst type (e.g., interleaved or sequential), one or more memory access latencies such as cas latency, and/or operating mode of the SDRAM 10. The mode registers 20 are programmed in response to a corresponding command and retain their settings until they are re-programmed or until the SDRAM 10 loses power.

In response to a decoded command, the control circuit 16 generates one or more internal control signals, e.g., ras, cas and write_en. The internal control signals enable, disable, or otherwise control various functions of the SDRAM 10 in order to execute particular commands. In one example, in response to a write command, the control circuit 16 activates write_en which directly or indirectly enables the storing of input data into array memory cells of the SDRAM 10. Further, the control circuit 16 generates ras and cas to control word and bit line activation, respectively. The write_en, ras and cas internal control signals are provided to various circuits of the SDRAM 10 during specific parts of a command cycle, as will be discussed further below.

Data input/output (I/O) buffer circuit 22 samples, or captures, input data signals (data<0:y>) during write operations and drives output data signals during read operations. During a write operation, input data signals are sampled by the data I/O buffer circuit 22 using a data strobe signal (data_strobe) as a timing reference. That is, input data is sampled in response to transitions in data_strobe. The data_strobe signal is generated by the external controller and is transmitted with input data to the SDRAM 10. The data I/O buffer circuit 22 can sample the input data on rising edges of data_strobe or can sample input data on rising and falling edges of data_strobe. The later sampling mode is commonly referred to as double-data rate (DDR) sampling. DDR sampling of input data enables the SDRAM 10 to capture y-bits of input data during the rising edge of data_strobe and capture another y-bits of input data during the falling edge of data_strobe. As such, in a DDR embodiment, the data I/O buffer circuit 22 provides x-bits of input data to the memory array 14 for storing during a write operation where x equals twice y. In a non-DDR embodiment, the data I/O buffer circuit 22 provides x-bits of input data to the memory array 14 where x equals y.

An address register 24 is configured to store an address associated with a particular location of the memory array 14 at which data is to be read from or written to during a memory operation. The stored address corresponds to external address signals (Addr) provided to the SDRAM 10 by the external controller. The external address signals received by the address register 24 indicate a particular row (word line) and column (bit line) to be selected within the memory array 14 during a corresponding memory operation.

Further, the address register 24 provides row and column addresses to row and column decoder circuits of the SDRAM 10, respectively, in response to the external address signals and the internal control signals. Particularly, the address register 24 provides a row address (row_addr) to the row address latch/decoder circuit 26 for activating a corresponding word line in the memory array 14 in response to an active ras signal. The address register 24 also provides a column address (col_addr) to the column decoder circuit 28 via a column address counter/latch circuit 30 for activating a corresponding bit line in the memory array 14 in response to an active cas signal. As such, a specific word and bit line of the memory array 14 can be selected, or activated, in response to an address associated with a particular command.

The row address latch/decoder circuit 26 receives the row address from the address register 24 and selects, or activates, the memory array word line that corresponds to the row address. Likewise, the column decoder circuit 28 selects the memory array bit line that corresponds to the column address. The column address counter/latch circuit 30 provides the column address to the column decoder 28. In addition, the column address counter/latch circuit 30 tracks the number of columns selected during a burst operation, e.g., a burst write, incrementing the column address accordingly until the burst operation is completed or terminated. Upon completion of a burst operation, the column address counter/latch circuit 30 generates a corresponding signal (end_burst) indicating completion of the burst operation and resets its burst counter.

A data control circuit 32 provides a data read/write gating mechanism by which data is either read from or written to the memory array 14. The data control circuit 32 includes a plurality of sense amplifiers (not shown) and I/O gating circuits such as read latches and write drivers (not shown). The sense amplifiers and I/O gating circuits can be arranged in any suitable configuration such as local, sub-array, global or other shared or unshared configurations. The read latches provide data sampled by the sense amplifiers to the data I/O buffer circuit 22 for transmission to the external controller during a read operation. The write drivers provide data to the memory array 14 for storing the data during a write operation. The internal write enable signal (write_en) enables specific I/O gating circuits associated with targeted memory cells during a particular operation.

The early write termination circuit 12, as illustrated in FIG. 1, is shown included in the control circuit 16 of the SDRAM 10. This depiction of the early write termination circuit 12 is for ease of description only and should not be construed as a limiting feature of the SDRAM 10 or the early write termination circuit 12. The early write termination circuit 12 may be wholly or partially integrated in the control circuit 16. Alternatively, the early write termination circuit 12 may be distributed throughout the SDRAM 10 in various circuits. Operation of the early write termination circuit 12 will be discussed in detail further below.

Figure 2:
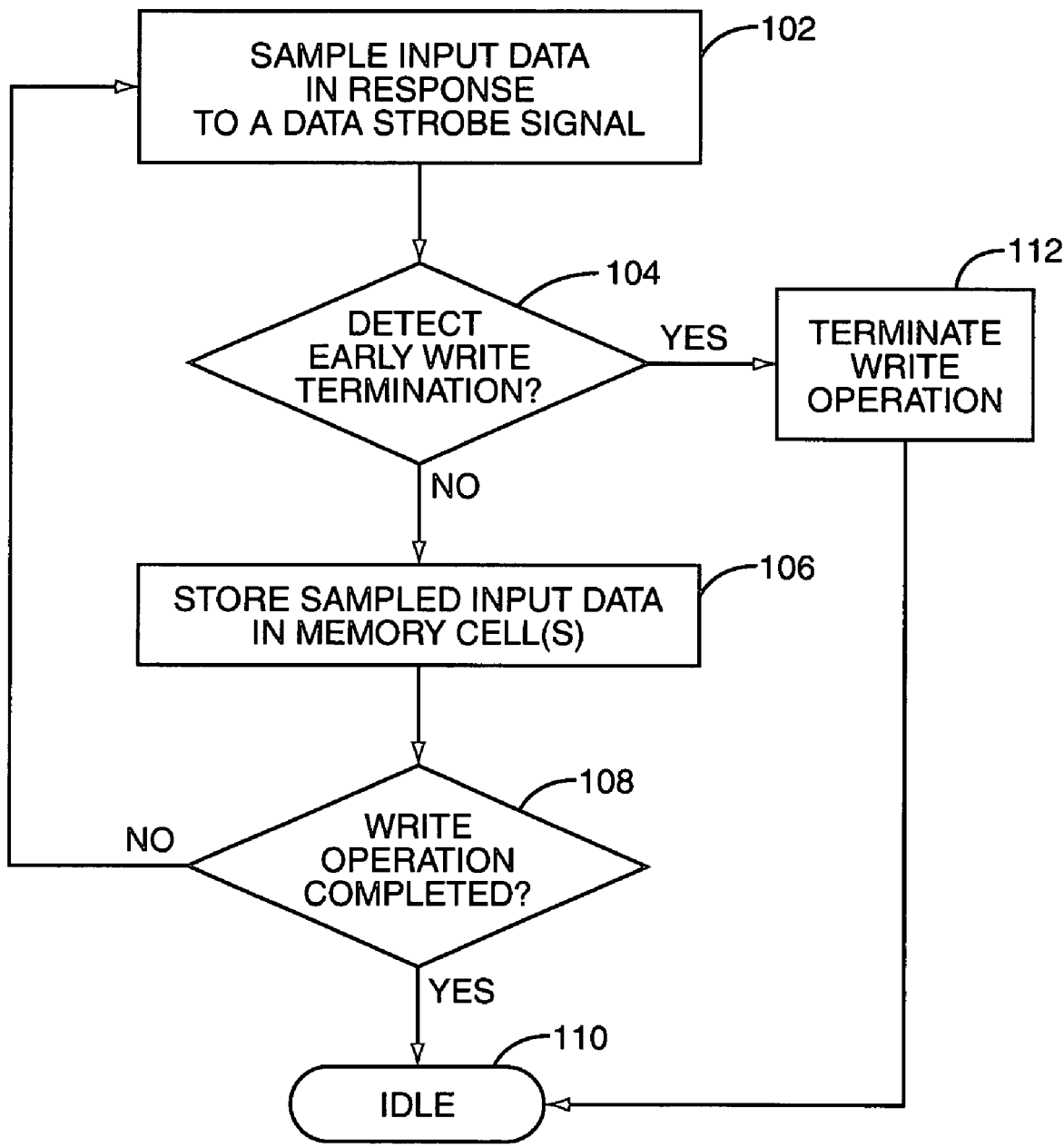
FIG. 2 is a logic flow diagram of one embodiment of program logic for terminating an ongoing memory write operation.

FIG. 2 illustrates one embodiment of program logic for terminating an ongoing SDRAM write operation. The program logic provides early write termination in an SDRAM by disabling or inhibiting storing of input data in one or more memory cells of the SDRAM during a write operation. For ease of description, the program logic will next be described with reference to the SDRAM 10 of FIG. 1. However, the program logic can be implemented in a variety of DRAMs, and, as such, the following description of the program logic should not be construed narrowly to apply only to the SDRAM architecture of FIG. 1.

The program logic "begins" with the SDRAM 10 sampling input data in response to a data strobe signal after a write operation has been initiated by an external memory controller (Step 102). For example, the data I/O buffer circuit 22 samples data in response to the data strobe and write enable signals as previously described. An external memory controller provides the data and data strobe signal to the SDRAM 10 during the ongoing write operation. While the SDRAM 10 is storing the sampled data in one or more of its memory cells, the ongoing write operation may be terminated before completion. The memory controller initiates early write termination by deactivating the data strobe signal during the ongoing write operation.

The early write termination circuit 12 monitors the data strobe signal for deactivation during the ongoing write operation to detect early write termination (Step 104). The SDRAM 10 continues to store the sampled input data in its memory cell(s) while the data strobe signal remains active during the ongoing write operation (Step 106). The SDRAM 10 samples a subsequent set of input data during the following clock cycle unless the write operation has completed (Step 108). The SDRAM 10 enters an idle state when the write operation is completed (Step 110). The SDRAM 10 remains in the idle state until instructed to do otherwise by the memory controller.

If the memory controller deactivates the data strobe signal during the ongoing write operation, the early write termination circuit 12 detects the deactivation and causes the SDRAM 10 to terminate the ongoing write operation before its completion (Step 112). That is, the SDRAM 10 disables or inhibits the storing of input data in the memory array 14 in response to the early write termination circuit 12 detecting deactivation of the data strobe signal. The SDRAM 10 enters an idle state when the write operation is terminated (Step 110). The SDRAM 10 remains in the idle state until instructed to do otherwise by the external controller.

Figure 3:
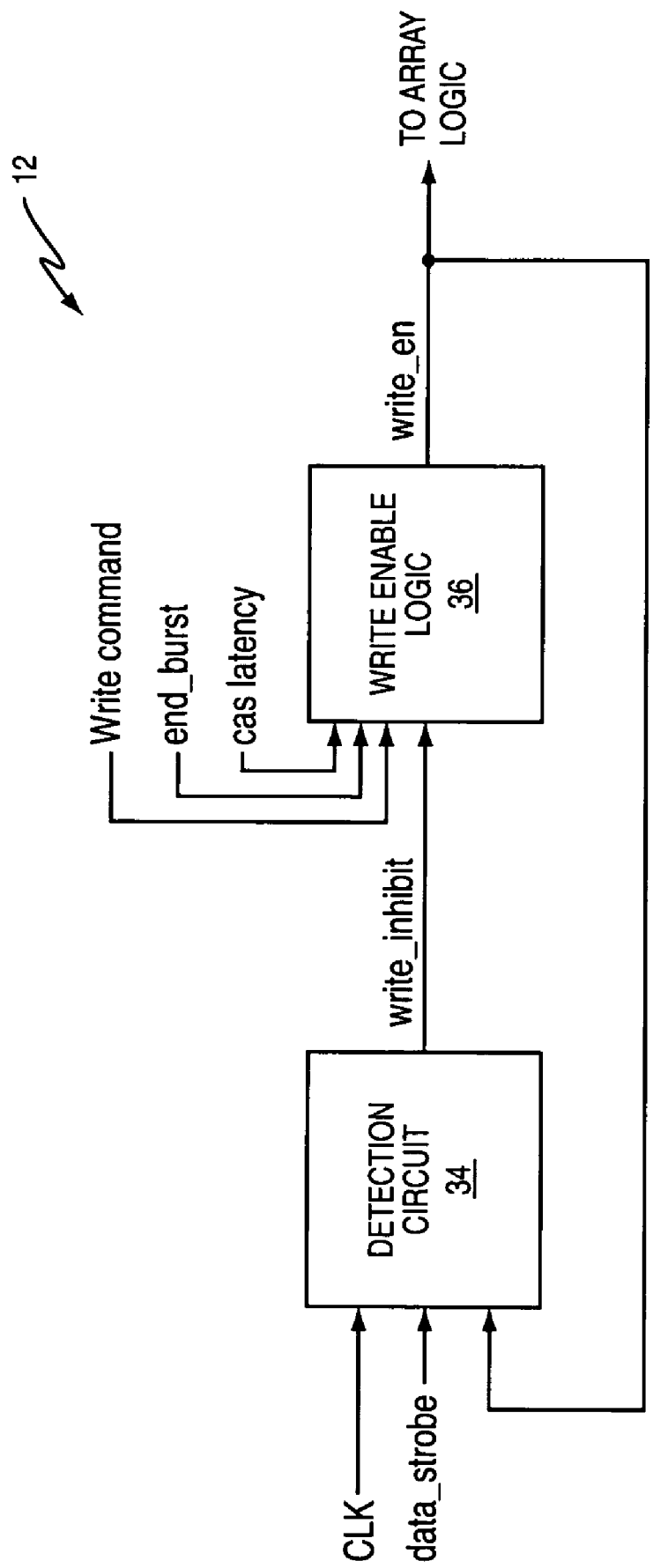
FIG. 3 is a block diagram of one embodiment of an early write termination circuit.

FIG. 3 illustrates an embodiment of the early write termination circuit 12. The early write termination circuit 12 includes a detection circuit 34 and write enable logic 36. The detection circuit 34 detects deactivation of the data strobe signal (data_strobe) during an ongoing write operation, i.e., when write_en is active. Particularly, the detection circuit 34 detects a missing transition of data_strobe during an active portion of a cycle of the internal system clock (CLK). That is, when a memory controller deactivates data_strobe to indicate early write termination, the memory controller causes data_strobe to not transition or toggle from one logic level to another during a particular CLK cycle. The missing data_strobe signal transition provides an indication to the early write termination circuit 12 that the ongoing write operation is to be terminated. The detection circuit 34 detects the missing data_strobe transition during an active portion of a CLK cycle. In response to detecting the missing data_strobe transition, the detection circuit 34 indicates to the write enable logic 36 that an ongoing write operation is to be terminated. For example, the detection circuit 34 asserts a write inhibit signal (write_inhibit) to indicate early write termination.

The write_inhibit signal indicates to the write enable logic 36 that data_strobe has been deactivated by the memory controller and that the ongoing write operation is to be terminated by the SDRAM 10. In response to write_inhibit, the write enable logic 36 deactivates the internal write enable signal (write_en). By deactivating write_en, the early write termination circuit 12 directly or indirectly causes the SDRAM 10 to terminate or truncate an ongoing write operation before its completion. Particularly, the deactivated write_en signal causes the SDRAM 10 to disable or otherwise inhibit storing of input data in one or more of its memory cells during the ongoing write operation.

Further, the write enable logic 36 may, as part of disabling write_en for early write termination, consider the programmed cas latency value stored in mode registers 20 of the SDRAM 10. The programmed cas latency corresponds to the number of clock cycles, e.g., CLK cycles, between the time a memory controller provides data to the SDRAM 10 to when the data is actually stored or written in the memory array 14 of the SDRAM 10.

By accounting for this delay, the write enable logic 36 causes the SDRAM 10 to store all input data sampled by the SDRAM 10 before deactivation of the data strobe signal is detected by the detection circuit 34. That is, the SDRAM 10 disables one or more memory cells of the memory array 14 after the cas latency lapses, thus allowing all validly sampled input data to be stored in the memory array 14 while precluding storage of invalid data. In other words, data elements of the programmed write burst that were validly sampled into the SDRAM 10 on data_strobe transitions are written into corresponding memory locations of the SDRAM 10, but access to those memory locations corresponding to the truncated portion of the write burst is inhibited to prevent the storage of invalid data in those locations.

For example, if cas latency is one CLK cycle, the write enable logic 36 disables write_en during the same CLK cycle in which data strobe deactivation was detected. If cas latency is greater than one CLK cycle, the write enable logic 36 disables write_en after sufficient CLK cycles have passed to allow validly sampled input data to be stored. As such, an ongoing write operation of the SDRAM 10 may be reliably terminated before the operation has been completed.

Still further, the write enable logic 36 maintains write_en in a deactivated state regardless of whether data_strobe is reactivated during a terminated write operation. As such, the write enable logic 36 prevents the early write termination circuit 12 from entering a spurious state while the SDRAM 10 terminates a write operation. Also, to prevent data corruption, the write enable logic 36 deactivates write_en when an ongoing write operation is deactivated or completed, e.g., the current write command is deactivated or end_burst indicates completion of a burst write operation.

Figure 4:
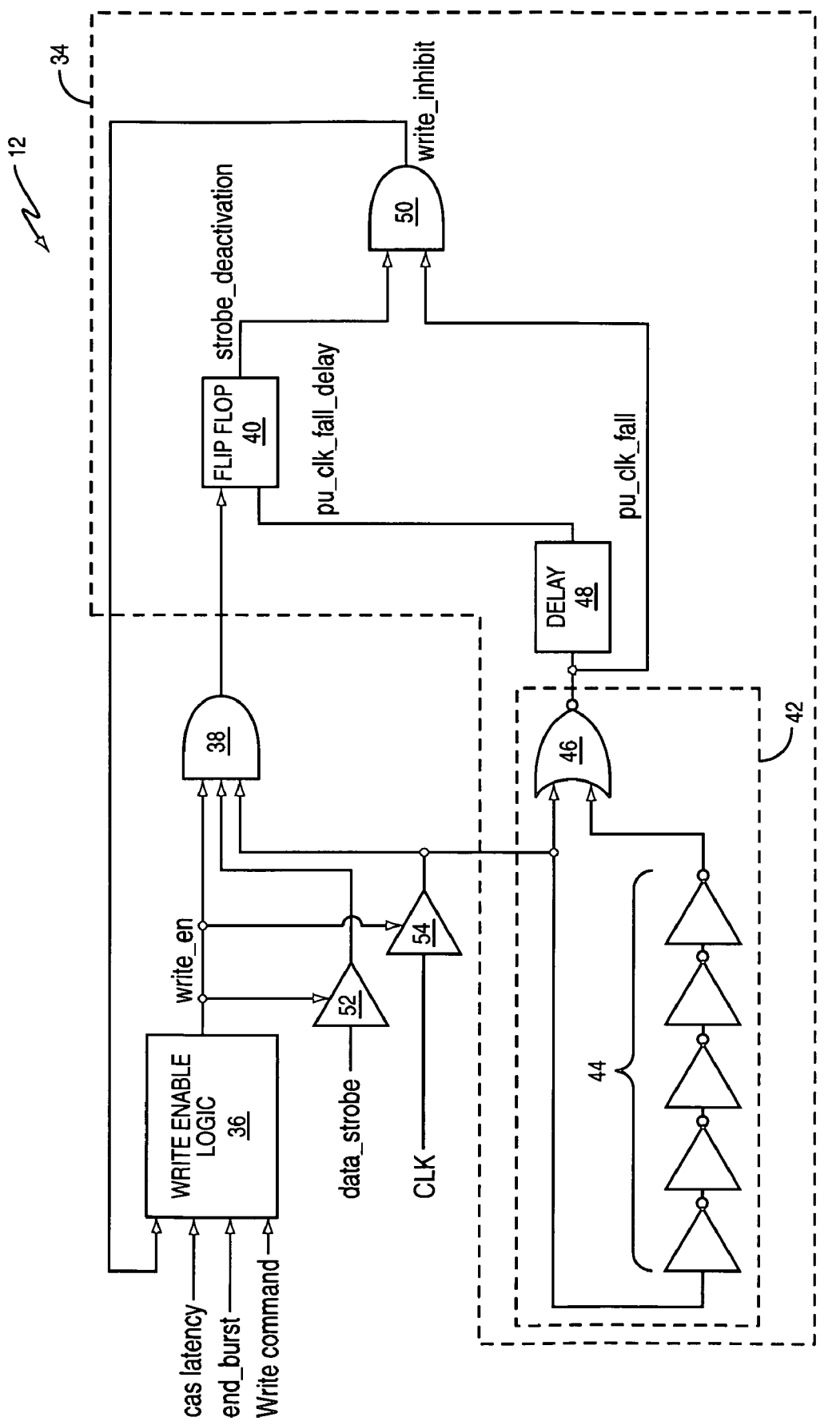
FIG. 4 is a circuit diagram of one embodiment of an early write termination circuit.

FIG. 4 illustrates an exemplary circuit implementation of the early write termination circuit 12. The exemplary circuit implementation is next described with reference to FIG. 5, which illustrates timing relationships of various signals generated by the early write termination circuit 12. Although the exemplary circuit implementation realizes the early write termination circuit 12 using specific combinatorial and sequential logic, those skilled in the art will recognize that various other combinations of sequential and/or combinatorial logic can be used to implement the function of the early write termination circuit 12. For example, the early write termination circuit 12 may be implemented using a Programmable Logic Device (PLD). In another example, the early write termination circuit 12 may be implemented using a gate array circuit such as a Field Programmable Gate Array (FPGA).

The early write termination circuit 12 includes the detection circuit 34 and the write enable logic 36. The detection circuit 34 detects deactivation of the data strobe signal (data_strobe) and generates a signal (write_inhibit) for indicating early write termination to the write enable logic 36. The write enable logic 36 terminates an ongoing write operation in response to write_inhibit by deactivating the internal write enable signal (write_en) of the SDRAM 10.

In more detail, the detection circuit 34 receives three signals: the internal system clock (CLK), write_en, and data_strobe. In response to CLK, write_en and data_strobe, the detection circuit 34 detects a missing transition of data_strobe during a CLK cycle. After detecting a missing transition in data_strobe, the detection circuit 34 provides a write inhibit signal (write_inhibit) to the write enable logic 36 to indicate early write termination. In operation, a three-input AND gate 38 receives CLK, write_en and data_strobe. The output of the three-input AND gate 38 is at a logic high level only when CLK, write_en and data_strobe are active, e.g., a logic high level. The write_en signal is initially active when the SDRAM 10 begins executing a write operation. The CLK signal comprises active an inactive portions during each cycle of CLK. When CLK is active during a write operation, the output of the three-input AND gate 38 is a logic high level unless data_strobe has been deactivated, e.g., data_strobe is at a logic low level. Thus, the output of the three-input AND gate 38 toggles in response to transitions in data_strobe when CLK and write_en are active.

The output of the three-input AND gate 38 is captured by the flip-flop 40. In one example, the flip-flop 40 may be an S-R (set-reset) flip-flop. As such, the output of the three-input AND gate 38 is received by the set input of the flip-flop 40. In response, the flip-flop 40 outputs true and complement versions of the output of the three-input AND gate 38. Further, the flip-flop 40 resets the true and complement outputs in response to a signal received at its reset input (pu_clk_fall_delay). A clock pulse generator 42 generates a periodic clock pulse (pu_clk_fall) and a delayed version of pu_clk_fall (pu_clk_fall_delay), the later clock pulse serving as the reset input to the flip-flop 40.

The reset input of the flip-flop 40, pu_clk_fall_delay, is delayed to account for skew in the data_strobe signal. If data_strobe signal skew is not accounted for, the output of the flip-flop 40 may unexpectedly change states during a flip-flop reset operation. By delaying the reset input of the flip-flop 40, the output of the flip-flop 40 can be reliably reset. Further, pu_clk_fall is delayed so that pu_clk_fall and the output of the flip-flop 40 (strobe_deactivation) have non-overlapping signal transitions.

The clock pulse generator 42 generates pu_clk_fall in response to both CLK and an inverted, delayed version of CLK being active. In one example, the clock pulse generator 42 includes an odd number of inverters 44 for delaying and inverting CLK. Further, the clock pulse generator 42 includes a NOR logic gate 46 for generating pu_clk_fall. A delay element 48 receives pu_clk_fall and generates pu_clk_fall_delay by delaying pu_clk_fall by a predetermined amount of time.

A logic gate 50 detects a missing transition in the toggle signal captured by the flip-flop 40. In response to detecting a missing transition of the toggle signal, the logic gate 50 asserts a write inhibit signal (write_inhibit) to indicate early write termination. In operation, the logic gate 50 receives the clock pulse pu_clk_fall and the complement output of the flip-flop 40 (strobe_deactivation). Because pu_clk_fall and strobe_deactivation have non-overlapping signal transitions, the output of the logic gate 50, write_inhibit, is a logic low level unless both pulse pu_clk_fall and strobe_deactivation are active at the same time, e.g., both signals are at a logic high level.

The complement output of the flip-flop 40, strobe_deactivation, transitions to a logic low level when data_strobe is a logic high level and strobe_deactivation transitions to a logic high level when data_strobe is a logic low level. As such, the transitions of strobe_deactivation mimic the transitions in data_strobe, albeit with some possible phase offset. Thus, strobe_deactivation fails to transition from one logic level to another when a transition in data_strobe is missing, i.e., data_strobe is deactivated by a memory controller. In response to a missing data_strobe transition, strobe_deactivation is "stuck" or remains at a particular logic level, e.g., a logic high level. The flip-flop 40 captures this "stuck" state during the CLK cycle in which data_strobe is deactivated. The lack of transition in strobe_deactivation is detected by the logic gate 50 during the following cycle of CLK.

The output of the logic gate 50, write_inhibit, transitions from its constant inactive level to a logic high level in response to the lack of transition in strobe_deactivation. The write_inhibit signal remains in the logic high level while the clock pulse pu_clk_fall is active. When pu_clk_fall goes inactive, write_inhibit transitions back to an inactive state. The write_inhibit signal continues to "pulse" during subsequent CLK cycles as described above so long as strobe_deactivation fails to transition during the subsequent CLK cycles.

Figure 5:
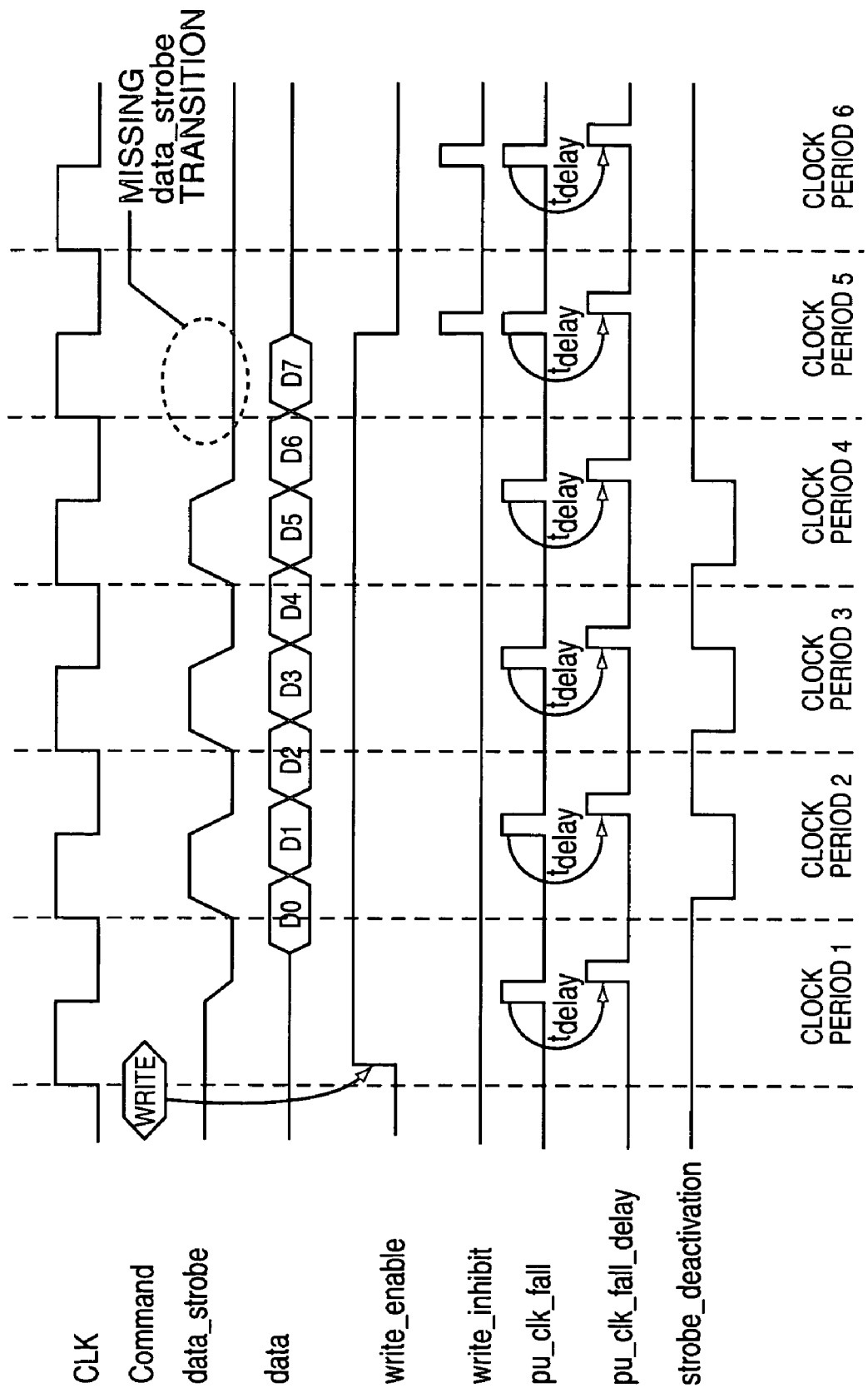
FIG. 5 is a timing diagram of various signals generated by the early write termination circuit of FIG. 4.

Turning now to FIG. 5, a timing diagram depicts timing signals associated with the early write termination circuit 12 during a DDR early write termination event. Four sets of data (D0-D1, D2-D3, D4-D5, D6-D7) are transmitted to the SDRAM 10 from a memory controller for storage in the SDRAM memory array 14 during a DDR burst write operation. However, after the third set of data is transmitted to the SDRAM 10 and stored, the memory controller deactivates data_strobe to indicate to the SDRAM 10 that the burst write operation is to be terminated and the last data set is not be stored in the SDRAM memory array 14.

The memory controller initiates the burst write operation by issuing a write command to the SDRAM during a first clock period. The SDRAM 10 activates its internal write enable signal (write_en) in response to the write command as previously described. The pu_clk_fall and pu_clk_fall_delay signals are generated in response to the subsequent falling edge of CLK during the first clock period, where pu_clk_fall_delay is a representation of pu_clk_fall delayed by $t_{delay}$. The memory controller causes data_strobe to have a rising edge transition from a high impedance state in response to the next rising edge of CLK during the second clock period. In response to the positive transition of data_strobe during the second clock period, data D0 is sampled by the SDRAM 10. Likewise, in a DDR embodiment, data D1 is sampled in response to the corresponding falling edge transition of data_strobe. Also in response to the rising edge transition of data_strobe during the second clock period, strobe_deactivation, the complement output of the flip-flop 44, transitions to a logic low level. The SDRAM 10 stores the data set D0-D1 in the memory array 14 during the next clock period (clock period three).

The strobe_deactivation signal remains in the logic low level until reset by pu_clk_fall_delay or until data_strobe transitions to a different logic level. When pu_clk_fall_delay becomes active, it triggers the reset function of the flip-flop 44. In this non-limiting illustration, the output of the flip-flop 44 is reset to a logic low level during the second clock when the pu_clk_fall_delay pulse occurs. Likewise, the complement output of the flip-flop 44, strobe_deactivation, transitions to a logic high level during the reset. As such, strobe_deactivation will continue to transition in a similar manner so long as the write command remains active and the memory controller does not deactivate data_strobe. For example, strobe_deactivation continues to transition in response to data_strobe and pu_clk_fall_delay during clock periods three and four. As a result, the data set D2-D3 is sampled by the SDRAM 10 during clock period three and stored in the memory array 14 during clock period four. Likewise, the data set D4-D5 is sampled during clock period four and stored in the memory array 14 during clock period five.

The output of the logic gate 50 (write_inhibit) remains set at a logic low level during the first four clock periods. This is so because the inputs to the logic gate 50, strobe_deactivation and pu_clk_fall, do not have the same logic high level during the first four clock periods. Accordingly, write_inhibit will remain at a low logic level during the ongoing write operation so long as data_strobe is not deactivated. When the memory controller deactivates data_strobe, e.g., data_strobe does not transition to a logic high level during a rising edge transition of CLK, such as during the fifth clock period, data_strobe fails to toggle. As such, when the clock pulse pu_clk_fall occurs during the fifth clock period, the logic gate 50 asserts a write_inhibit pulse. The write_inhibit pulse indicates to the write enable logic 36 that the memory controller has initiated an early write termination. In response, the write enable logic 36 deactivates the internal memory write enable signal (write_en), thus causing the SDRAM 10 to not store the data set D6-D7 in its memory array 14 during the following clock period, i.e., the sixth clock period.

Returning to FIG. 4, the logic gate 50 provides write_inhibit to the write enable logic 36. The write enable logic 36 terminates an ongoing write operation by deactivating write_en in response to write_inhibit being asserted during the ongoing write operation. Further in response to write_inhibit being asserted, the write enable logic 36 disables driver circuits 52, 54 configured to provide data_strobe and CLK, respectively, to the detection circuit 34. As such, the early write termination circuit 12 maintains write_en in a deactivated state regardless of whether data_strobe is reactivated by a memory controller during an ongoing write operation, thus preventing the early write termination circuit 12 from entering a spurious state. After the ongoing write operation is completed or deactivated, e.g., after the current write command is deactivated, the write enable logic 36 re-enables the driver circuits 52, 54 for subsequent write operations.

In one example, the write enable logic 36 includes a finite state machine having several signal inputs. One signal input indicates that the SDRAM 10 is executing a write operation, such as the write command as decoded by the command decoder 18. Another signal input indicates that a given write operation has completed (end_burst). In one example, end_burst may be generated by the column address counter/latch circuit 30 when a burst write is completed. A third signal input is the programmed cas latency stored in the mode registers 20 of the SDRAM 10. A fourth signal input is write_inhibit.

Figure 6:
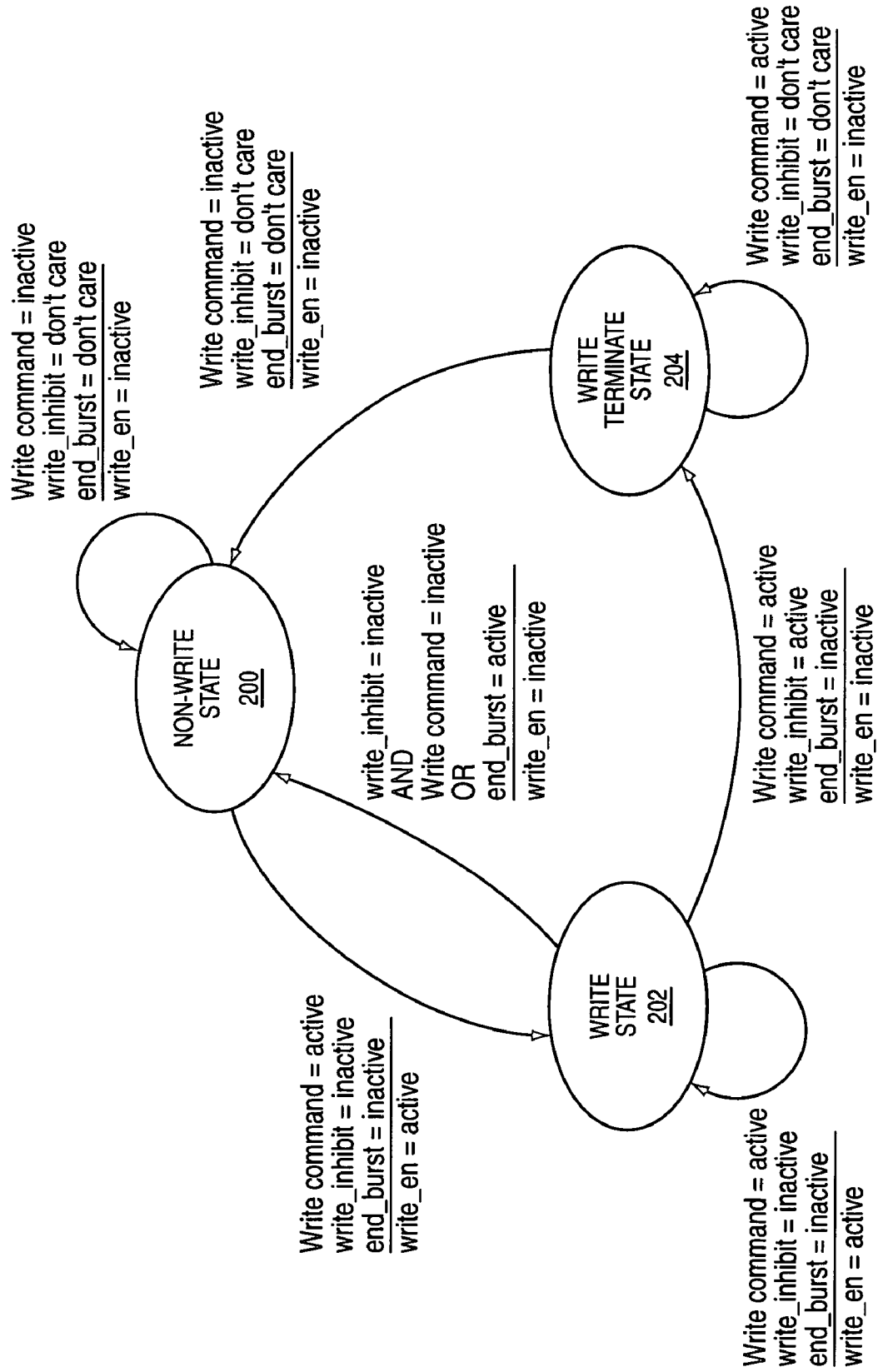
FIG. 6 is a state transition diagram of one embodiment of control logic associated with an early write termination circuit.

FIG. 6 illustrates an embodiment of state transition logic associated with the write enable logic 36 of the early write termination circuit 12. Initially, the write enable logic 36 is in a non-write state 200. That is, any valid memory operation other than write is being executed by the SDRAM 10. When in the non-write state 200, the write enable logic 36 maintains write_en in a deactivated state (e.g., write_en=inactive). The write enable logic 36 remains in the non-write state 200 until a write command is received and decoded by the SDRAM 10. After the SDRAM 10 decodes the write command (e.g., write command=active), the write enable logic 36 enters a write state 202 and activates write_en (e.g., write_en=active). While in the write state 202, the SDRAM 10 stores sampled input data in its memory cells as previously described. The write enable logic 36 remains in the write state 202 until the write operation is completed (e.g., end_burst=active), the write operation is terminated (e.g., write_inhibit=active) or the write command is deactivated (e.g., write command=inactive). Upon completion of a write operation or deactivation of the write command, the write enable logic 36 returns to the non-write state 200 and deactivates write_en.

If write_inhibit is asserted while the write enable logic 36 is in the write state 202 (e.g., write_inhibit=active), the write enable logic 36 transitions to a write terminate state 204 and deactivates write_en. By deactivating write_en, the write enable logic 36 terminates the ongoing write operation as previously described. The write enable logic 36 remains in the write terminate state 204 until the write command is deactivated, e.g., by the issuance of a subsequent memory command, at which time the write enable logic 36 returns to the non-write state 200.

Thus, according to the above state transition logic, the SDRAM 10 terminates an ongoing write operation at less than a defined burst length by disabling its internal write enable logic in response to detecting data strobe deactivation. Particularly, the SDRAM 10 disables the storage of data in one or more memory cells of the memory array 14 to carry out early write termination. In one example, the SDRAM 10 disables write drivers included in or associated with the data control circuit 32. That is, data will not be stored in a memory cell of the SDRAM 10 during a write operation when the write driver associated with that memory cell is disabled. In other examples, other circuits and/or functions associated with storing data in memory cells of the SDRAM 10 may be disabled in response to detecting data strobe deactivation.

Figure 7:
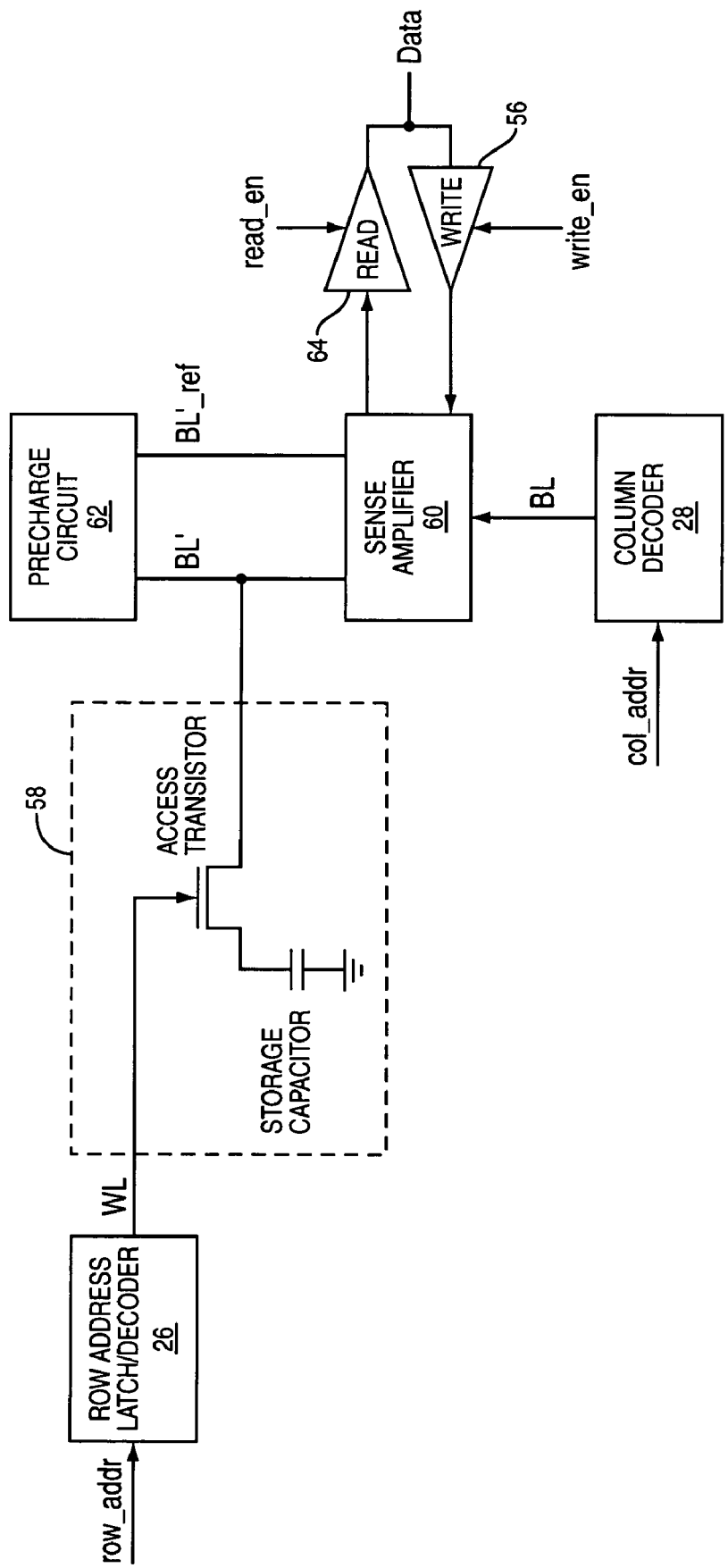
FIG. 7 is a block diagram of one embodiment of a memory cell and corresponding I/O gating circuits.

FIG. 7 illustrates one embodiment of a write driver 56 configured to disable writing of data into memory cells of the SDRAM 10 in response to write_en being deactivated during an ongoing write operation. During memory activation, the row address latch/decoder circuit 26 activates the target word line (WL) in response to the row address (row_addr). In response, memory cells associated with the activated word line are selected. For ease of illustration, only one memory cell 58 is shown. Particularly, the access transistor of the selected memory cell 58 is switched 'on' by the activated word line, thus coupling the storage capacitor of the memory cell 58 to the bit line (BL'). Prior to activating a sense amplifier 60 associated with the target bit line, a precharge circuit 62 charges the BL' and the corresponding reference bit line (BL'_ref) of the selected memory cell 58. As such, BL' and BL'_ref are pre-charged to the same level, e.g., Vdd/2, for improved performance. Once pre-charged, the column decoder 28 selects the sense amplifier 60 associated with the selected memory cell 58 in response to the column address (col_addr). At this point, the memory cell 58 is ready to have data written to or read from it.

During a read operation, a read latch 64 drives data sensed by the sense amplifier 60 to the data I/O buffer circuit 22 in response to a read enable signal (read_en). During a write operation, the write driver 56 provides data to the selected memory cell 58 via the sense amplifier 60 in response to the write enable signal (write_en). When write_en is deactivated by the SDRAM 10 in response to a memory controller initiating an early write termination, data will not be stored in the memory cell 58 because the write driver 56 will be disabled.

Figure 8:
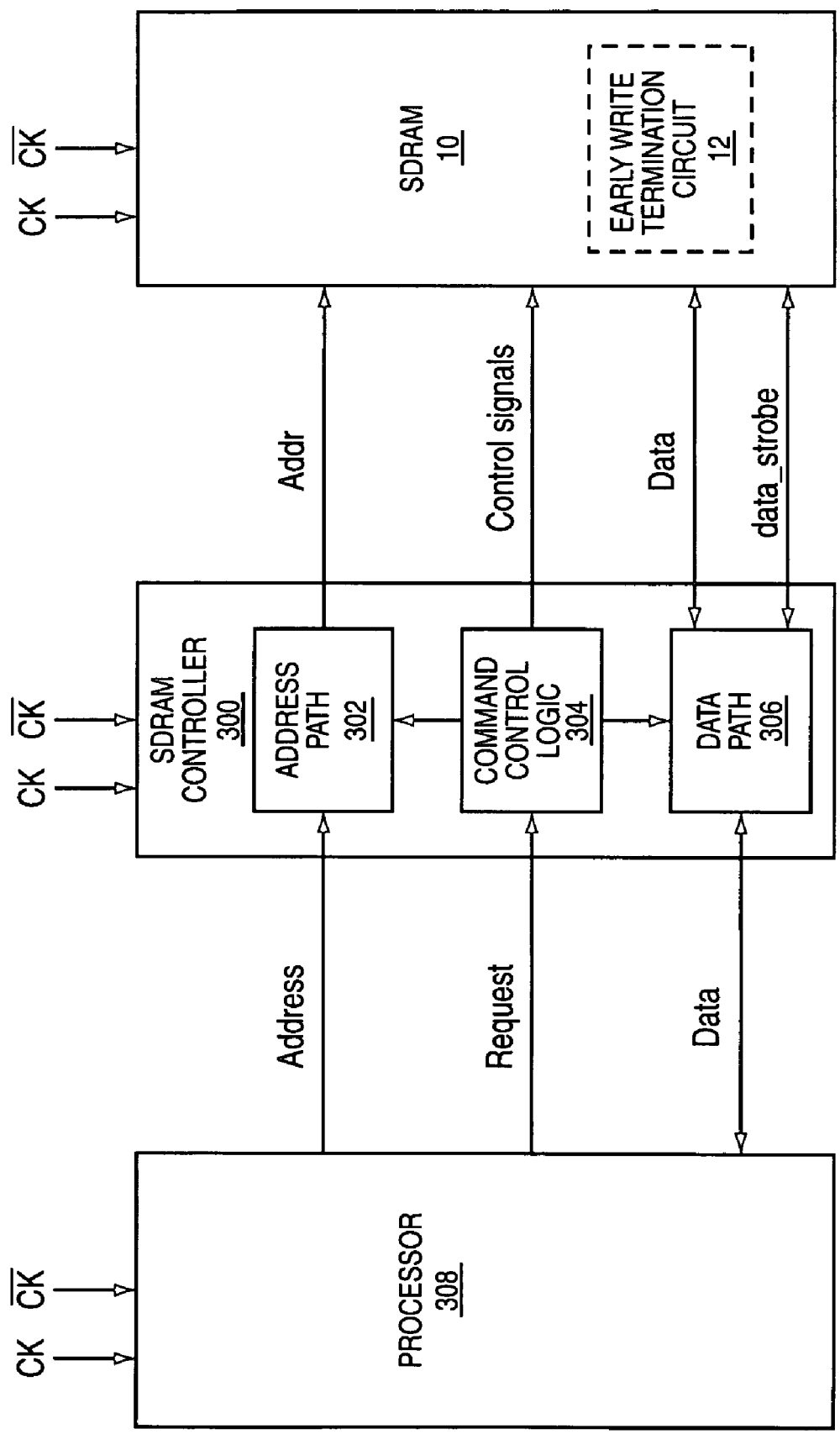
FIG. 8 is a block diagram of one embodiment of a memory controller configured to indicate early write termination to a memory device.

An embodiment of a memory controller 300, shown in FIG. 8, indicates early write termination to the SDRAM 10 by deactivating a data strobe signal (data_strobe) during an ongoing write operation. The memory controller 300 includes an address path 302, command control logic 304, and a data path 306. The command control logic 304 generates commands for the SDRAM 10 in response to requests received from a processor 308, or other device accessing the SDRAM 10 via the memory controller 300. Particularly, the command control logic 304 issues commands in the form of control signals to the SDRAM 10. In one example, the command control logic 304 issues control signals such as $\overline{CS}$, $\overline{WE}$, $\overline{CAS}$, and $\overline{RAS}$ to the SDRAM 10.

The memory controller 300 issues a sequence of commands to the SDRAM 10 to initialize the SDRAM 10, for example, by programming the mode registers 20 included in the SDRAM 10. Particularly, the memory controller 300 may provide various parameters to the SDRAM 10 such as burst length, burst type, one or more latency values, and/or operating modes to program for storage in the mode registers 20. In addition, the command control logic 304 governs operation of the address and data paths 302, 306 of the memory controller 300 in accordance with the commands issued by the memory controller 300 to the SDRAM 10. In one example, the command control logic 304 comprises a finite state machine.

The address path 302 provides memory addresses (Addr) to the SDRAM 10 that correspond to memory addressing information received, for example, from the processor 308 by the memory controller 300. During write operations, a data strobe signal (data_strobe) is output by the memory controller 300 for use by the SDRAM 10 when storing data received from the data path 306. During read operations, data_strobe is output by the SDRAM 10 for use by the data path 306 when receiving data from the SDRAM 10.

The command control logic 304 indicates early write termination to the SDRAM 10 by deactivating data_strobe during an ongoing write operation. For example, the processor 308 issues a command to the memory controller 300 to indicate that an ongoing write operation is to be terminated by the SDRAM 10. In response, the command control logic 304 deactivates data_strobe. In one example, the command control logic 304 causes a data strobe driver circuit (not shown) associated with or included in the data path 306 to be disabled. As such, data_strobe can be deactivated during an ongoing write operation, thus alerting the SDRAM 10 to terminate the operation. The processor 308, memory controller 300 and SDRAM 10 may operate in synchronization in accordance with a system clock (CK and $\overline{CK}$).

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of terminating a write operation in a synchronous dynamic random access memory (SDRAM) at less than a programmed burst length, comprising:
   detecting early deactivation of a data strobe signal applied to the SDRAM during write operations; and
   disabling memory cell access within the SDRAM responsive to said early deactivation of the data strobe signal to prevent the storage of invalid data.

2. The method of claim 1, wherein disabling memory cell access within the SDRAM responsive to said early deactivation of the data strobe signal comprises disabling access at least to memory locations corresponding to a truncated portion of the programmed burst length as indicated by deactivation of the data strobe signal.

3. The method of claim 2, wherein disabling memory cell access within the SDRAM responsive to said early deactivation of the data strobe signal comprises disabling one or more driver circuits that control access to said memory locations corresponding to the truncated portion of the programmed burst length.

4. The method of claim 1, wherein disabling memory cell access within the SDRAM responsive to said early deactivation of the data strobe signal comprises disabling write enable logic of the SDRAM.

5. The method of claim 1, wherein detecting early deactivation of a data strobe signal applied to the SDRAM during write operations comprises detecting a missing transition of the data strobe signal during the write operation.

6. The method of claim 1, wherein disabling memory cell access within the SDRAM responsive to said early deactivation of the data strobe signal occurs after the storage of valid data.

7. A synchronous dynamic random access memory (SDRAM) comprising:
- a buffer circuit configured to sample input data responsive to a data strobe signal applied to the SDRAM during a write operation and direct the input data to one or more memory cells of the SDRAM for storing the input data; and
- an early write termination circuit configured to terminate the write operation at less than a programmed burst length by disabling access to one or more of the memory cells after storage of the sampled input data responsive to detecting deactivation of the data strobe signal.

8. The SDRAM of claim 7, wherein the early write termination circuit is configured to disable access to one or more of the memory cells after storage of the sampled input data by disabling one or more driver circuits that direct data to the one or more memory cells for storage responsive to detecting deactivation of the data strobe signal.

9. The SDRAM of claim 7, wherein the early write termination circuit is configured to disable access to one or more of the memory cells after storage of the sampled input data by disabling write enable logic of the SDRAM responsive to detecting deactivation of the data strobe signal.

10. The SDRAM of claim 7, wherein the early write termination circuit comprises:
- a detection circuit configured to detect deactivation of the data strobe signal; and
- a write enable circuit configured to terminate the write operation at less than the programmed burst length by disabling access to one or more of the memory cells after storage of the sampled input data responsive to the detection circuit detecting deactivation of the data strobe signal.

11. The SDRAM of claim 10, wherein the detection circuit is configured to detect deactivation of the data strobe signal by detecting a missing transition of the data strobe signal during the write operation.

12. A synchronous dynamic random access memory (SDRAM) comprising:
- one or more memory cells for storing input data;
- means for sampling the input data responsive to a data strobe signal applied to the SDRAM during a write operation and for directing the sampled input data to one or more of the memory cells; and
- means for terminating the write operation at less than a programmed burst length by disabling access to one or more of the memory cells after storage of the sampled input data responsive to detecting deactivation of the data strobe signal.

13. The SDRAM of claim 12, wherein the means for terminating the write operation at less than the programmed burst length by disabling access to one or more of the memory cells after storage of the sampled input data comprises:
- detection means for detecting deactivation of the data strobe signal; and
- write enable means for terminating the write operation at less than the programmed burst length by disabling access to one or more of the memory cells after storage of the sampled input data responsive to the detection means detecting deactivation of the data strobe signal.

14. The SDRAM of claim 13, wherein the detection means detects deactivation of the data strobe signal by detecting a missing transition of the data strobe signal during the write operation.

15. A control circuit for use in a synchronous dynamic random access memory (SDRAM), comprising:
- a detection circuit configured to detect deactivation of a data strobe signal applied to the SDRAM during a write operation; and
- a write enable circuit configured to terminate the write operation at less than a programmed burst length responsive to the detection circuit detecting deactivation of the data strobe signal.

16. The control circuit of claim 15, wherein the detection circuit is configured to detect deactivation of the data strobe signal by detecting a missing transition of the data strobe signal during the write operation.

17. The control circuit of claim 15, wherein the detection circuit comprises:
- a first logic circuit configured to generate a toggle signal during an active portion of a synchronization clock cycle responsive to transitions in the data strobe signal;
- a latch circuit configured to capture the toggle signal responsive to a delayed version of the synchronization clock cycle; and
- a second logic circuit configured to detect a missing transition of the toggle signal and assert a corresponding write inhibit signal before a subsequent synchronization clock cycle occurs.

18. The control circuit of claim 15, wherein the write enable circuit is further configured to deactivate the detection circuit during the write operation responsive to deactivation of the data strobe signal and to reactivate the detection circuit responsive to initiation of a subsequent write operation by the SDRAM.

19. A control circuit included in a synchronous dynamic random access memory (SDRAM), comprising:
- detection means for detecting deactivation of a data strobe signal applied to the SDRAM during a write operation; and
- write enable means for terminating the write operation at less than a programmed burst length responsive to the detection circuit detecting deactivation of the data strobe signal.

20. The control circuit of claim 19, wherein the detection means comprises:
- first logic means for generating a toggle signal during an active portion of a synchronization clock cycle responsive to transitions in the data strobe signal;
- latch means for capturing the toggle signal responsive to a delayed version of the synchronization clock cycle; and
- second logic means for detecting a missing transition of the toggle signal and asserting a corresponding write inhibit signal before a subsequent synchronization clock cycle occurs.

21. The control circuit of claim 19, further comprising deactivation means for deactivating the detection means during the write operation responsive to deactivation of the data strobe signal and for reactivating the detection means responsive to initiation of a subsequent write operation by the SDRAM.

22. A method of detecting early write termination in a synchronous dynamic random access memory (SDRAM), comprising:
- detecting deactivation of a data strobe signal applied to the SDRAM during a write operation; and
- terminating the write operation at less than a programmed burst length responsive to detecting deactivation of the data strobe signal.

23. The method of claim 22, wherein detecting deactivation of the data strobe signal comprises detecting a missing transition of the data strobe signal during the write operation.

24. The method of claim 22, wherein terminating the write operation at less than a programmed burst length comprises:

generating a toggle signal during an active portion of a synchronization clock cycle responsive to transitions in the data strobe signal;

capturing the toggle signal responsive to a delayed version of the synchronization clock cycle; and detecting a missing transition of the toggle signal and asserting a corresponding write inhibit signal before a subsequent synchronization clock cycle occurs.

25. A memory controller comprising control logic configured to terminate an ongoing write operation by deactivating a data strobe signal directed to a synchronous dynamic access memory (SDRAM) by the memory controller during the ongoing write operation.

26. The memory controller of claim 25, wherein the control logic is configured to deactivate the data strobe signal by disabling one or more driver circuits that generate the data strobe signal.

27. A method of controlling a synchronous dynamic access memory (SDRAM) by a memory controller, comprising:

generating a data strobe signal by the memory controller during an ongoing write operation; and terminating the ongoing write operation by deactivating the data strobe signal during the ongoing write operation.

28. The method of claim 27, wherein deactivating the data strobe signal during the ongoing write operation comprises disabling one or more driver circuits that generate the data strobe signal.

* * * * *